United States Patent
Kondo

(10) Patent No.: US 9,623,516 B2
(45) Date of Patent: Apr. 18, 2017

(54) ETCHING METHOD AND BEVEL ETCHING APPARATUS

(71) Applicant: Tokyo Electron Limited, Tokyo (JP)

(72) Inventor: Masaki Kondo, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1 day.

(21) Appl. No.: 14/729,131

(22) Filed: Jun. 3, 2015

(65) Prior Publication Data

US 2015/0352669 A1    Dec. 10, 2015

(30) Foreign Application Priority Data

Jun. 9, 2014    (JP) .................. 2014-118946

(51) Int. Cl.
| | | |
|---|---|---|
| H01L 21/00 | (2006.01) | |
| B23K 26/36 | (2014.01) | |
| B23K 26/40 | (2014.01) | |
| B23K 26/30 | (2014.01) | |
| H01L 21/67 | (2006.01) | |
| B23K 26/06 | (2014.01) | |
| B23K 26/362 | (2014.01) | |
| H01L 21/66 | (2006.01) | |
| H01L 21/02 | (2006.01) | |

(52) U.S. Cl.
CPC ........ B23K 26/365 (2013.01); B23K 26/0626 (2013.01); B23K 26/362 (2013.01); B23K 26/4075 (2013.01); B23K 26/426 (2013.01); H01L 21/6708 (2013.01); H01L 21/67115 (2013.01); H01L 21/67253 (2013.01); H01L 22/00 (2013.01); H01L 21/02087 (2013.01)

(58) Field of Classification Search
CPC .................................................. H01L 21/76894
See application file for complete search history.

(56) References Cited

U.S. PATENT DOCUMENTS

| | | | | |
|---|---|---|---|---|
| 7,615,131 B2* | 11/2009 | Lim | .................. | H01J 37/32091 118/723 E |
| 2007/0273852 A1* | 11/2007 | Arai | ...................... | G03F 7/7005 355/44 |
| 2009/0184234 A1* | 7/2009 | Shindo | .................. | B23K 26/046 250/206 |

FOREIGN PATENT DOCUMENTS

JP    2010-141237    6/2010

* cited by examiner

*Primary Examiner* — Zandra Smith
*Assistant Examiner* — Andre' C Stevenson
(74) *Attorney, Agent, or Firm* — IPUSA, PLLC

(57) ABSTRACT

An etching method using a bevel etching apparatus is provided. The bevel etching apparatus is configured to etch a substrate by emitting a laser beam and includes a laser generator and a power meter configured to measure the laser beam output from the laser generator. In the method, the power meter is irradiated with the laser beam for a predetermined period of time before etching the substrate by irradiating the substrate with the laser beam. An output value of the laser beam is measured by the power meter. It is determined whether the measured output value of the laser beam is in a range of predetermined thresholds with respect to an output setting value of the laser beam output from the laser generator.

5 Claims, 10 Drawing Sheets

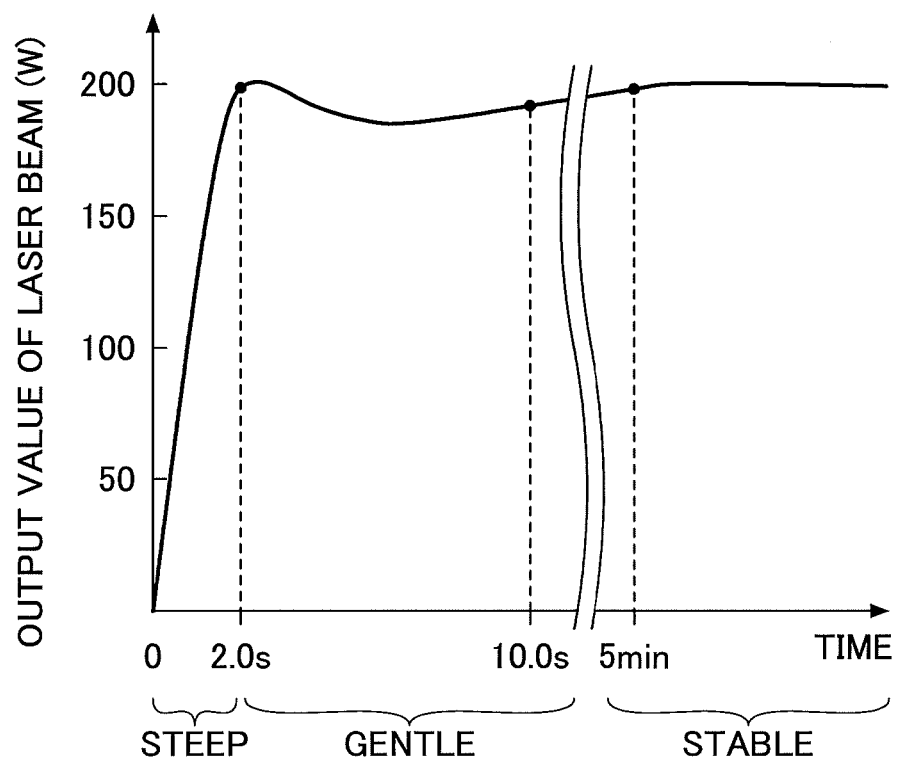

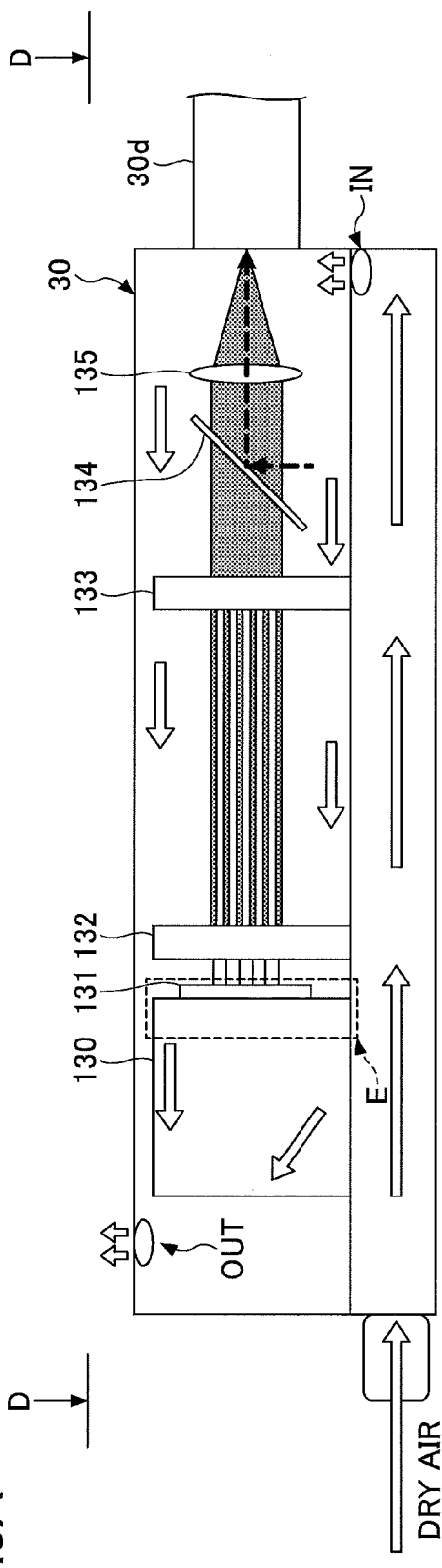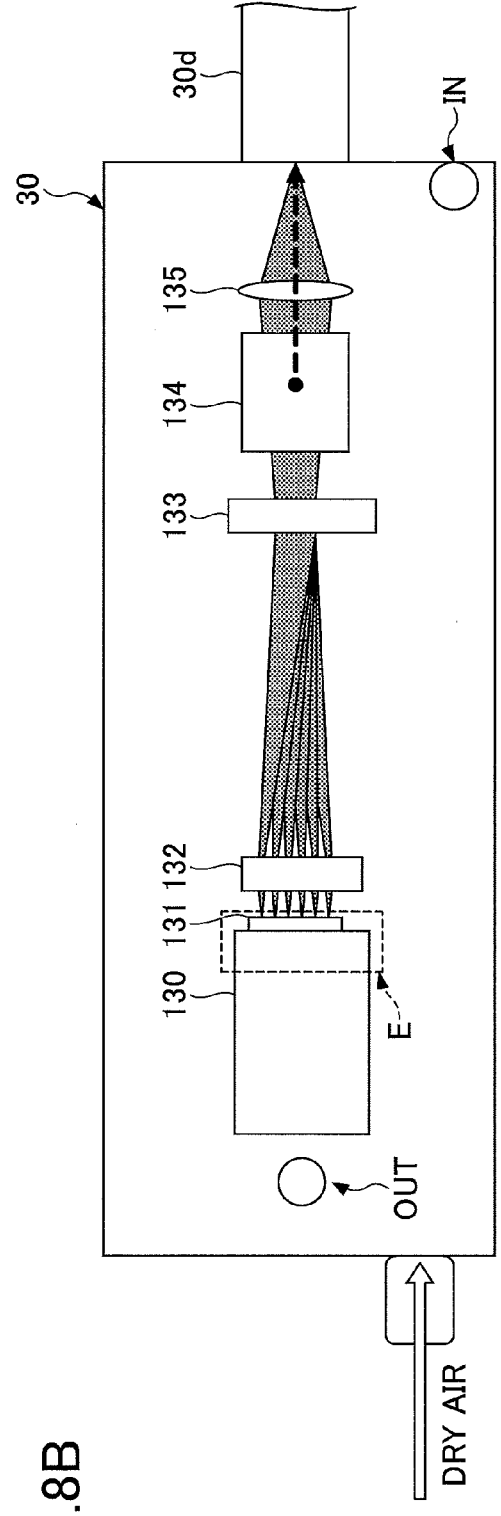

ETCHING METHOD AND BEVEL ETCHING APPARATUS

CROSS-REFERENCE TO RELATED APPLICATIONS

This patent application is based upon and claims the benefit of priority of Japanese Patent Application No. 2014-118946, filed on Jun. 9, 2014, the entire contents of which are incorporated herein by reference.

BACKGROUND OF THE INVENTION

1. Field of the Invention

The present invention relates to an etching method and a bevel etching apparatus.

2. Description of the Related Art

A bevel/backside polymer attached to a bevel portion (chamfered portion of a wafer edge) of a semiconductor wafer (which may be hereinafter just called a "wafer") contaminates a surface of a device or affects a yield rate of a product.

In response to this, Japanese Laid-Open Patent Application Publication No. 2010-141237 proposes an apparatus that irradiates a bevel portion of a wafer with a laser beam, thereby removing a bevel/backside polymer by etching. The output intensity of the laser beam emitted to the bevel portion is managed by monitoring and controlling a current supplied to a laser generator.

However, even when the current supplied to the laser generator is constant, the output intensity of the laser beam varies due to a malfunction or a temporal change of the laser generator. When an output value of the laser beam is out of order and the failure cannot be detected, the bevel portion of the wafer is liable to be irradiated with the laser beam having power higher than a prescribed value, and is liable to be scraped and chipped.

SUMMARY OF THE INVENTION

Accordingly, in response to the above discussed problems, embodiments of the present invention aim to provide an etching method and a bevel etching apparatus that monitor a laser beam before emitted to a bevel portion of a substrate and detect variation of an output of the laser beam.

According to one embodiment of the present invention, there is provided an etching method using a bevel etching apparatus. The bevel etching apparatus is configured to etch a substrate by emitting a laser beam and includes a laser generator and a power meter configured to measure the laser beam output from the laser generator. In the method, the power meter is irradiated with the laser beam for a predetermined period of time before etching the substrate by irradiating the substrate with the laser beam. An output value of the laser beam is measured by the power meter. It is determined whether the measured output value of the laser beam is in a range of predetermined thresholds with reference to an output setting value of the laser beam output from the laser generator.

According to another embodiment of the present invention, there is provided a bevel etching apparatus configured to etch a substrate by irradiating the substrate with a laser beam. The bevel etching apparatus includes a laser generator configured to output the laser beam. An output setting value of the laser beam is set for the laser generator. The bevel etching apparatus further includes a power meter configured to measure an output value of the laser beam output from the laser generator, and a control unit configured to control the laser generator and the power meter. The control unit is configured to cause the laser generator to irradiate the power meter with the laser beam for a predetermined period of time before etching the substrate by irradiating the substrate with the laser beam and to obtain the output value of the laser beam measured by the power meter. Moreover, the control unit is configured to determine whether the obtained output value of the laser beam is within a range of predetermined thresholds with respect to the output setting value set for the laser generator. Furthermore, the control unit is configured to perform at least an automatic correction process of correcting the output setting value of the laser beam set for the laser generator and a predetermined error process upon determining that the obtained output value of the laser beam is out of the range of the predetermined thresholds.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 3 is a graph illustrating an example of a temporal variation of an output value of a laser beam measured by a power meter according to an embodiment of the present invention;

FIGS. 8A and 8B are diagrams illustrating an example of an inner configuration of a laser generator according to an embodiment of the present invention;

DETAILED DESCRIPTION OF THE PREFERRED EMBODIMENTS

Figure 1:
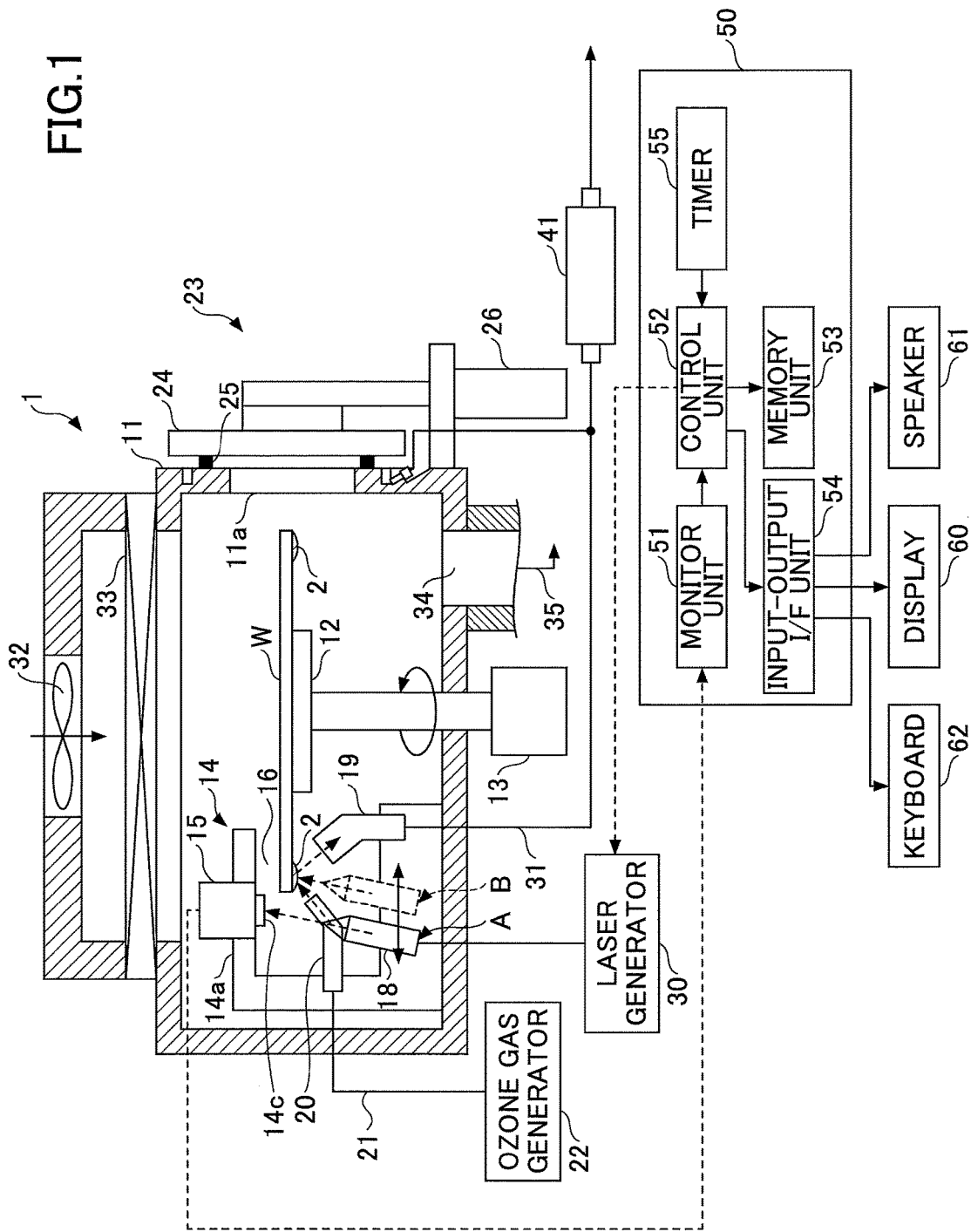
FIG. 1 is a diagram illustrating an example of an overall configuration of a bevel etching apparatus according to an embodiment of the present invention.

A description is given below of embodiments of the present invention, with reference to accompanying drawings. Note that elements having substantially the same configuration may be given the same reference numerals and overlapping descriptions thereof may be omitted.

[Introduction]

In manufacturing semiconductor integrated circuits, when a plasma etching is performed on a wafer, radicals and ions generated in plasma go around to a bevel surface of a back surface of the wafer, and a polymer attaches to the bevel surface and the back surface of the wafer. The attachments are called a bevel/backside polymer (which is hereinafter called a "BSP"). The BSP contaminates a surface of a semiconductor integrated circuit device or affects a yield rate of a product. Therefore, the BSP is removed by a heat treatment using a laser beam and ozone gas. A description is given below of an embodiment of a bevel etching apparatus for removing the BSP.

[Overall Configuration of Bevel Etching Apparatus]

A description is given below of an example of an overall configuration of an etching apparatus 1 according to an embodiment of the present invention with reference to FIG. 1. FIG. 1 illustrates the example of the overall configuration of the etching apparatus 1 according to the embodiment of the present invention. The bevel etching apparatus 1 removes a BSP 2 attached to a bevel portion of a wafer W by etching the wafer W by emitting a laser beam. FIG. 1 illustrates a state of the BSP 2 attached to the bevel portion of the back surface of the wafer W.

The bevel etching apparatus 1 includes a chamber 11 that is a container for accommodating the wafer W therein. A spin chuck 12 is provided inside the chamber 11 to horizontally and rotatably hold the wafer W. The spin chuck 12 is connected to a rotary motor 13 provided under the chamber 11. The spin chuck 12 rotates the wafer W while holding the wafer by, for example, vacuum suction.

A BSP removal unit 14 is provided at a location corresponding to a periphery of the wafer W inside the chamber 11. A cut-out part 16 is provided in a main body 14a of the BSP removal unit 16 to allow the periphery of the wafer W to pass therethrough while rotating. A laser irradiation head 18 is provided in a lower part of the cut-out part 16. The laser irradiation head 18 is connected to a laser generator 30. The laser irradiation head 18 irradiates the bevel portion of the wafer with a laser beam output from the laser generator 30. The laser irradiation head 18 is movable in a horizontal direction along a lower part of the main body 14a. Moreover, the laser irradiation head 18 can change an angle of the laser irradiation. This allows a laser irradiation position to be adjustable.

A power meter 15 is attached to an upper part of the main body 14a. A disk-like member 14c, to a lower surface of which a material for adsorbing the laser beam emitted from below is applied, is provided on the bottom part of the power meter 15. The power meter 15 can measure an output value of the laser beam based on heat adsorbed by the adsorbing material of the disk-like member 14c.

The laser irradiation head 18 moves in the horizontal direction to a position A where the wafer W is not irradiated with the laser beam, and irradiates the power meter 15 with the laser beam for a predetermined period of time before etching the wafer W. After that, the laser irradiation head 18 moves in the horizontal direction to a position B where the laser irradiation head 18 can irradiate a periphery of the wafer W with the laser beam, and removes the BSP 2 by emitting the laser beam.

An ozone gas discharge nozzle 20 that discharges ozone gas to the BSP 2 and an ozone gas suction nozzle 19 that suctions approximately 100% ozone gas are provided in the main body 14a. The ozone gas discharge nozzle 20 is connected to an ozone gas generator 22 through a supply line (i.e., pipe) 21 for supplying ozone gas. Ozone gas output from the ozone gas generator 22 is introduced into the chamber 11 from the ozone gas discharge nozzle 20 through the supply line 21. An exhaust pipe 31 constituted of an exhaust passage for mainly evacuating ozone gas is connected to the ozone gas suction nozzle 19. The exhaust pipe 31 is connected to a factory oxide exhaust pipe (not illustrated in the drawings). An ozone killer 41 that decomposes ozone gas is connected to the exhaust pipe 31.

A fan 32 for suctioning and taking the air into the chamber 11 and a filter 33 for removing particles in the air suctioned by the fan 32 are provided on the upper side of the chamber 11. On the other hand, an exhaust opening 34 is provided in the bottom part of the chamber 11. A downflow of the cleaned air is formed in the chamber 11 by taking the air into the chamber 11 through the filter 33 and evacuating the taken air from the exhaust opening 34. An exhaust pipe 35 is connected to the exhaust opening 34, and the exhaust pipe 35 is connected to the factory oxide exhaust pipe (not illustrated in the drawings).

A wafer transfer opening 11a is provided in a side wall of the chamber 11, and the wafer transfer opening 11a is openable and closeable by a gate valve 23.

The gate valve 23 includes a valving element 24 and an air cylinder 26 for opening and closing the valving element 24. When the valving element 24 closes the wafer transfer opening 11a, a gap between the valving element 24 and the chamber 11 is sealed by a seal ring 25.

The bevel etching apparatus 1 includes a control device 50 for controlling a whole of the bevel etching apparatus 1. The control device 50 includes a monitor unit 51, a control unit 52, a memory unit 53, an input-output I/F (interface) unit 54 and a timer 55.

The timer 55 measures an irradiation period of time of the laser beam. The monitor unit 51 monitors the output value (power) of the laser beam that the power meter 15 has measured. More specifically, the output value of the laser beam measured by the power meter 15 is input to the monitor unit 51, and the monitor unit 51 outputs the output value to the control unit 52.

The control unit 52 includes a micro processing unit. The control unit 52 is connected to the input-output I/F 54, and is further connected to a keyboard 62, a display 60 and a speaker 61 through the input-output I/F 54. An operator performs an input operation to input a command and the like for managing the bevel etching apparatus 1 by using the keyboard 62. The display 60 displays predetermined information.

The memory unit 53 stores a control program for performing predetermined control and a recipe. The memory unit 53 may store thresholds to determine whether the output value of the laser beam measured by the power meter 15 is within a normal range. The memory unit 53 may store a correction graph showing a correlation between a control current of the laser generator 30 and the output value of the laser beam illustrated in FIG. 5. The control unit 52 controls a removal process of the BSP by calling any recipe from the memory unit 53 and implementing the called recipe depending on an instruction and the like from the input-output I/F unit 54. Moreover, the control unit 52 performs feedback control of the output value of the laser beam depending on the output value of the laser beam measured by the power meter 15 based on an automatic correction program for implementing an automatic correction process stored in the memory unit 53.

The control unit 52 executes an error process based on the threshold values stored in the memory unit 53 when the measured output value of the laser beam is determined to be out of the range of the threshold values. On this occasion, the control unit 52 may display a message indicating abnormality of the output value of the laser beam on the display 60 through the input-output I/F unit 54. Furthermore, the control unit 52 may issue a warning sound indicating the abnormality of the output value of the laser beam from the speaker 61 through the input-output I/F unit 54.

The control device 50 includes a CPU (Central Processing Unit), a ROM (Read Only Memory), a RAM (Random Access Memory) and the like that are not illustrated in the drawings. A function of the control unit 52 is implemented by the CPU. A function of the memory unit 53 is implemented by the ROM or the RAM. The CPU controls supply of ozone gas, irradiation of the laser beam and executes the removal process of the BSP in accordance with the recipe stored in a memory area such as the ROM and the like. In addition, the CPU detects the abnormality of the monitored output value of the laser beam, and manages the control current for supplying to the laser generator 30. Here, a function of the control unit 52 may be implemented by using software or hardware. As described above, the description has been given of the example of the overall configuration of the bevel etching apparatus 1.

[Operation of Bevel Etching Apparatus]

Figure 2:
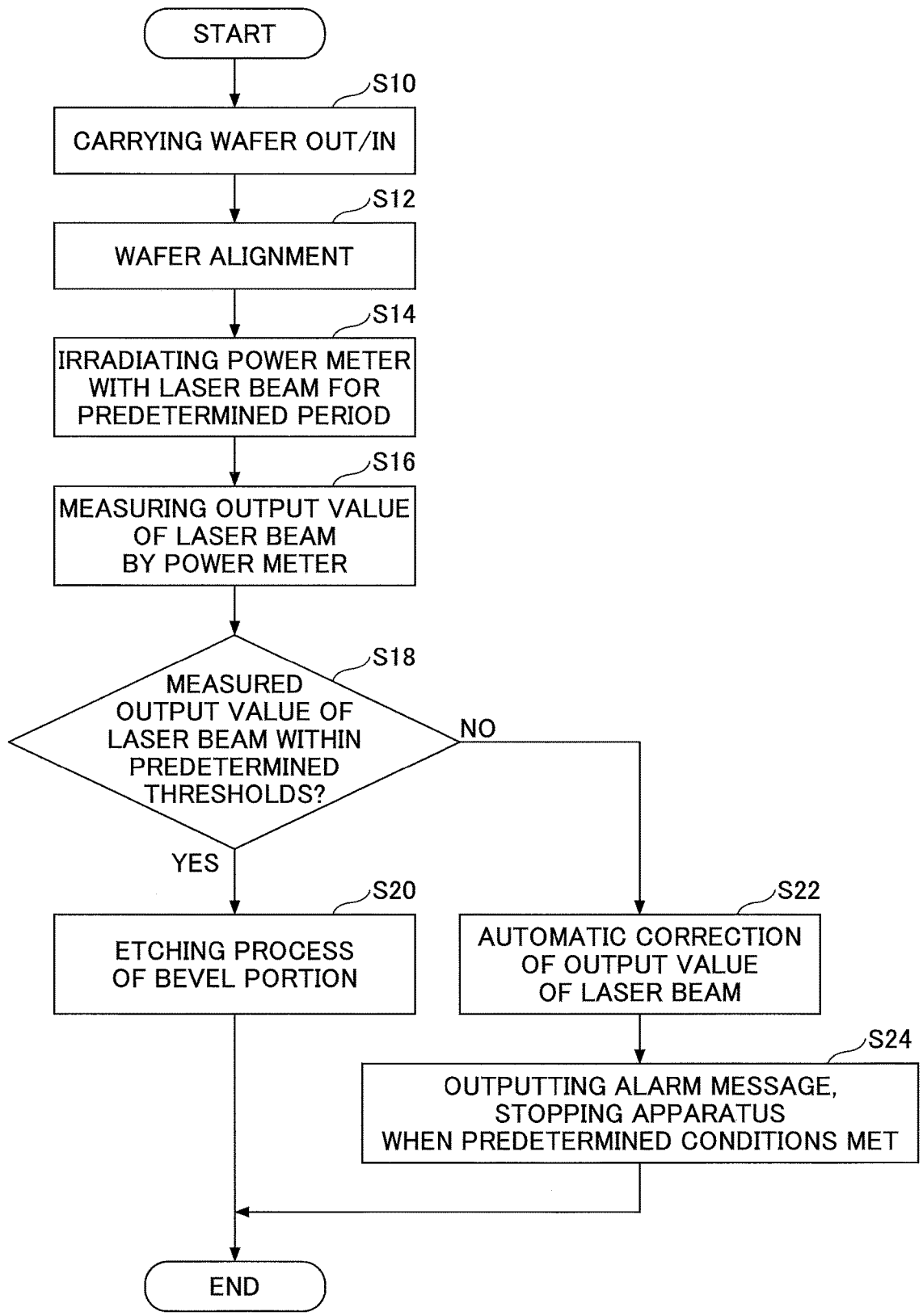
FIG. 2 is a flowchart illustrating an example of an etching process according to an embodiment of the present invention.

Next, a description is given below of an operation of the bevel etching apparatus 1 according to the embodiment of the present invention, that is, an etching method using the bevel etching apparatus 1 with reference to FIG. 2. FIG. 2 is a flowchart illustrating an example of the etching process (removal process of the BSP) that the bevel etching apparatus 1 according to the embodiment performs.

In the bevel etching apparatus 1 of the embodiment, to begin with, the valving element 24 of the gate valve 23 is opened, and an unprocessed wafer W is carried into the chamber 11 after a processed wafer W is carried out of the chamber 11 through the transfer opening 11a by a transfer arm that is not illustrated in the drawings (step S10). The valving element 24 of the gate valve 23 is closed, and the inside of the chamber 11 is hermetically kept. The wafer W carried into the chamber 11 is suctioned by being evacuated in a state of being aligned (step S12).

Next, the laser irradiation head 18 irradiates the power meter 15 with a laser beam at a position where the wafer W is not irradiated with the laser beam (position A in FIG. 1) for a predetermined period of time (step S14). At this time, the predetermined period of time when irradiating the power meter 15 with the laser beam is preferred to be equal to or longer than two seconds. The predetermined period of time may be equal to or shorter than ten seconds. The power meter 15 measures an output value of the emitted laser beam (step S16).

FIG. 3 illustrates an example of a temporal change of the output value of the laser beam measured by the power meter 15. According to the graph, the output value of the laser beam measured by the power meter 15 sharply increases for about two seconds from the start of measurement, gently decreases after that, and becomes stable in about five minutes to ten minutes. For example, assuming that the measurement value of the power meter 15 after a lapse of five minutes from the start of measurement is adopted as an output value of the laser beam by waiting for the operation of the power meter 15 to completely stabilize depending on the operational characteristics of the power meter 15, the throughput and productivity decreases.

In contrast, because the change of the measurement value of the power meter 15 for two seconds from the start of measurement is sharp, it is difficult to adopt the measurement value of the power meter 15 during the period of time (i.e., two seconds in FIG. 3). Therefore, in the embodiment, the measurement value of the power meter 15 after a lapse of two seconds to ten seconds from the start of measurement where the output value of the power meter 15 becomes stable is adopted as the output value of the laser beam. This enables the abnormality of the output value of the laser beam emitted from the laser irradiation head 18 to be correctly determined.

A description is given below with reference to FIG. 2 again. Next, the control unit 52 determines whether the output value of the laser beam measured by the power meter 15 is in predetermined threshold values (step S18). At this time, the predetermined threshold values can be set, for example, at ±10%.

Figure 4B:
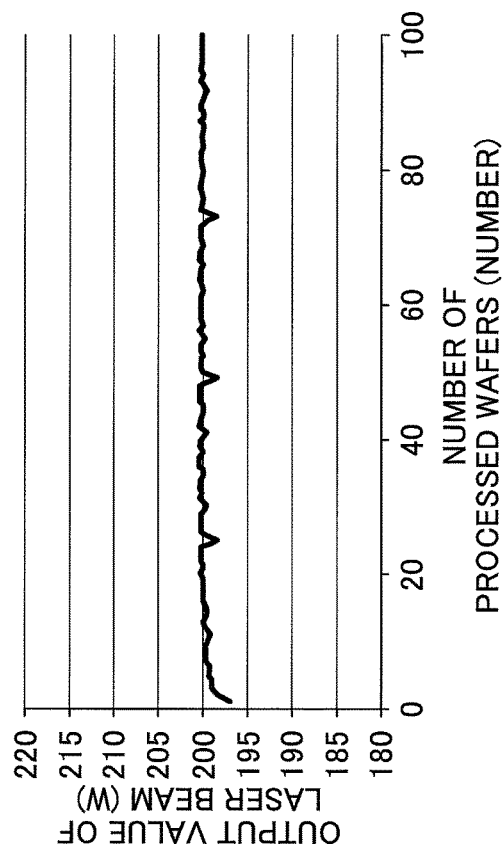
FIGS. 4A and 4B are graphs showing an example of a measurement result of a power meter according to an embodiment of the present invention.
Figure 4A:
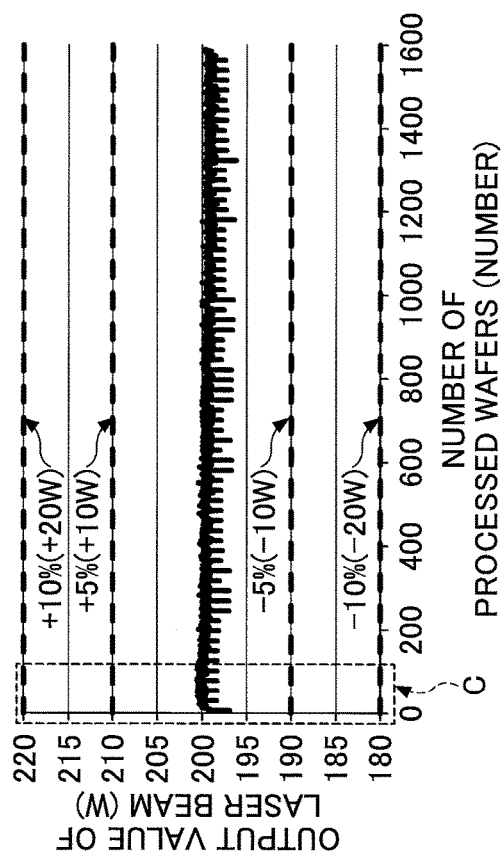

FIGS. 4A and 4B show an example of a measurement result of the power meter 15 according to the embodiment. FIG. 4A shows output values of the laser beam relative to the number of processed wafers W. FIG. 4B shows an output value of the laser beam relative to the number of processed wafers W (up to 100 wafers) in a range C illustrated in FIG. 4A.

At this time, an output setting value (target value of the output value) of the laser beam output from the laser generator 30 is about 200 W. In other words, FIGS. 4A and 4B show the output value of the laser beam measured by the power meter 15 when the output setting value is set at 200 W so that the laser generator 30 outputs the laser beam of 200 W.

According to the result, as shown in FIG. 4B, it is noted that the output values of the laser beam measured when the number of processed wafers is 1 to 3, 26, 51 and 76, are lower than the other number of processed wafers.

Usually, a single lot is composed of 25 wafers. When starting use of the power meter 15 and shifting from the present lot to the next lot, there is a period of time when the power meter 15 does not operate as illustrated in FIG. 3, thereby slightly decreasing an internal temperature of the power meter 15. As described later, the power meter 15 measures the output value of the laser beam based on a temperature change of a light absorption material caused by irradiating the light absorption material with the laser beam. Accordingly, even if the power meter 15 is irradiated with the laser beam with constant intensity, when the internal temperature of the power meter 15 decreases, the measured output value of the laser beam becomes lower than the actual output value. For the reasons stated above, the output values of the laser beam measured when the number of processed wafers W was 1 to 3, 26, 51 and 76 (timing of changing the lot), were lower than the output values of the laser beam measured when the number of processed wafers W was the other number by 3 or 4 W.

The decrease of the output value of the laser beam at the beginning of use of the power meter 15 and the beginning of processing each lot is not caused by a malfunction of the laser generator 30 but by an external factor. In other words, the laser generator 30 operates normally in itself. Thus, the decrease of the output value of the laser beam in such a range should not be determined to be abnormal. Therefore, as shown in FIG. 4A, with respect to the measurement result of the power meter 15, when the output value of the laser beam is in a range of ±10% with reference to 200 W of an output setting value of the laser generator 30 (180 through 220 W), it is determined that the output value of the laser beam is not abnormal.

A description is given below with reference to FIG. 2 again. In step S18, when it is determined that the measured output value of the laser beam is in a range of ±10%, the control unit 52 performs an etching process of the bevel portion (step S20). In the etching process of the bevel portion, to begin with, the control unit 52 causes the laser irradiation head 18 to horizontally move to a position where the laser irradiation head 18 can irradiate the periphery of the wafer W with the laser beam (position B in FIG. 1). Next, by driving the rotary motor 13 so as to rotate the spin chuck 12, the wafer W held on the spin chuck by being suctioned is rotated. Then, the laser irradiation head 18 of the BSP removal unit 14 irradiates the bevel portion of the wafer W with the laser beam while rotating the wafer W, and further the ozone gas discharge nozzle 20 discharges ozone gas to the bevel portion while the ozone suction gas nozzle 19 suctions ozone gas. This causes the BSP 2 to be removed due to the heat caused by the laser irradiation and the oxidation caused by ozone gas. When performing the BSP removal process, ozone gas is supplied from the ozone gas discharge nozzle 20, and ozone gas is exhausted from the ozone gas suction nozzle 19 through the exhaust pipe 31 as an exhaust passage.

On the other hand, in step S18, when the measured output value of the laser beam is out of the range of ±10%, the control unit 52 automatically corrects the output value of the laser beam output from the laser generator 30 (step S22).

A description is given below of an example of the automatic correction in step S22 with reference to FIG. 5. The correction graph is preliminarily stored in the memory unit 53. The correction graph shows the output value of the laser beam with respect to a current supplied to the laser generator 30. For example, a straight line P indicates a reference value of the output value of the laser beam corresponding to the current supplied to the laser generator 30.

A straight line Q and a straight line R indicate variations of the output value of the laser beam caused by a malfunction of the laser generator 30, the deterioration of the laser generator 30 due to its lifetime, or a change of the laser beam collection efficiency of a lens or a mirror inside the laser generator 30. The straight line Q indicates a state in which the output value of the laser beam corresponding to the current supplied to the laser generator 30 is lower than the reference value of the straight line P. The straight line R indicates a state in which the output value of the laser beam corresponding to the current supplied to the laser generator 30 is higher than the reference value of the straight line P.

Figure 5:
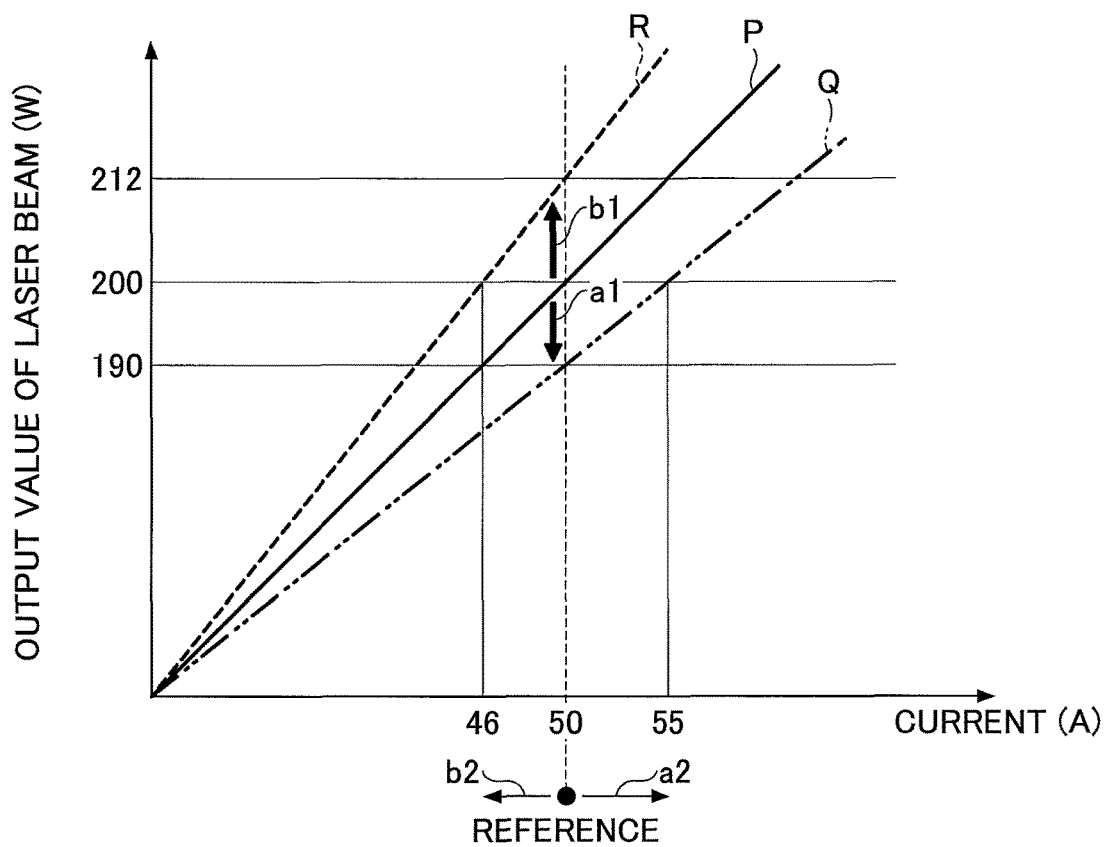
FIG. 5 is a graph illustrating an example of a correction graph according to an embodiment of the present invention.

In the correction graph illustrated in FIG. 5, the output value of the laser beam is 200 W when the current is 50 A in the straight line P of the reference. When the output value of the laser beam measured by the power meter 15 decreases from 200 W to 190 W (a1 in FIG. 5), as illustrated by the straight line Q, the control unit 52 causes the current supplied to the laser generator 30 to increase to 55 A in order to acquire the output value of the laser beam of 200 W (a2 in FIG. 5).

Moreover, when the measured output value of the laser beam rises from 200 W to 212 W (b1 in FIG. 5), as illustrated by the straight line R, the control unit 52 causes the current supplied to the laser generator 30 to decrease to 46 A in order to acquire the output value of the laser beam of 200 W (b2 in FIG. 5). In this manner, the control unit 52 performs feedback control so as to automatically correct the output value of the laser beam based on the correction graph. This causes the output value of the laser beam to be higher than the reference value, which can prevent a chip from occurring in the periphery of the wafer W when irradiating the wafer W with the laser beam. Furthermore, this prevents the removal of the BSP on the bevel portion from not being able to perform smoothly due to the output value of the laser beam lower than the reference value.

A description is given below of the etching method with reference to FIG. 2 again. The control unit 52 displays an alarm message on the display 60 through the input-output I/F unit 54 (step S24). In addition, the control unit 52 stops the bevel etching apparatus 1 when predetermined conditions are met (step S24). Determining the measured output value of the laser beam to be out of a range of −(10+α)% to (10+α) is taken as an example of the predetermined conditions. Here, a is any number equal to or more than zero. The chip of the wafer W is generated when the measured output value of the laser beam is out of the range of ±10% with reference to the output setting value of the laser generator 30. For the reasons stated above, in the embodiment, when the measured output value of the laser beam is determined to be out of the range of −(10+α)% to (10+α)%, the output value of the laser beam is determined to be abnormal, and the bevel etching apparatus 1 is temporarily stopped. This causes the bevel portion of the wafer W to be irradiated with the laser beam having the power higher than a prescribed value, so scraping and chipping the bevel portion of the wafer can be prevented.

As discussed above, the description has been given of the operation of the bevel etching apparatus 1 according to the embodiment. According to bevel etching apparatus 1 of the embodiment, by providing the power meter 15 and monitoring the output value of the laser beam before processing the wafer W by the power meter 15, the abnormality of the output value of the laser beam can be detected before processing the wafer W, and breakage of the wafer W can be prevented by performing the automatic correction of the output value of the laser beam and the like.

Here, in step S14, the laser irradiation head 18 irradiates the power meter 15 with the laser beam for about two to about ten seconds in a state in which the laser irradiation head 18 is arranged at a position where the wafer W cannot be irradiated with the laser beam (e.g., position A in FIG. 1). However, the embodiments are not limited to this embodiment, and the laser irradiation head 18 may emit the laser beam at a position where the wafer W is irradiated with the laser beam (e.g., position B). In this case, the power meter 15 measures the laser beam except for the laser beam blocked by the periphery of the wafer W, and the control unit 52 performs the abnormality determination process from step S18 in FIG. 2 based on the measured output value of the laser beam.

In the above description, the measurement value of the power meter 15 has been the output value of the laser beam. However, the embodiments are not limited to this embodiment. For example, by converting the output value of the laser beam to the control current of the laser generator 30 based on the straight line P of the reference, the abnormality determination of the laser beam in FIG. 2 may be performed by using the control current to the laser generator 30 instead of the output value of the laser beam,

[Power Meter]

Figure 6A:
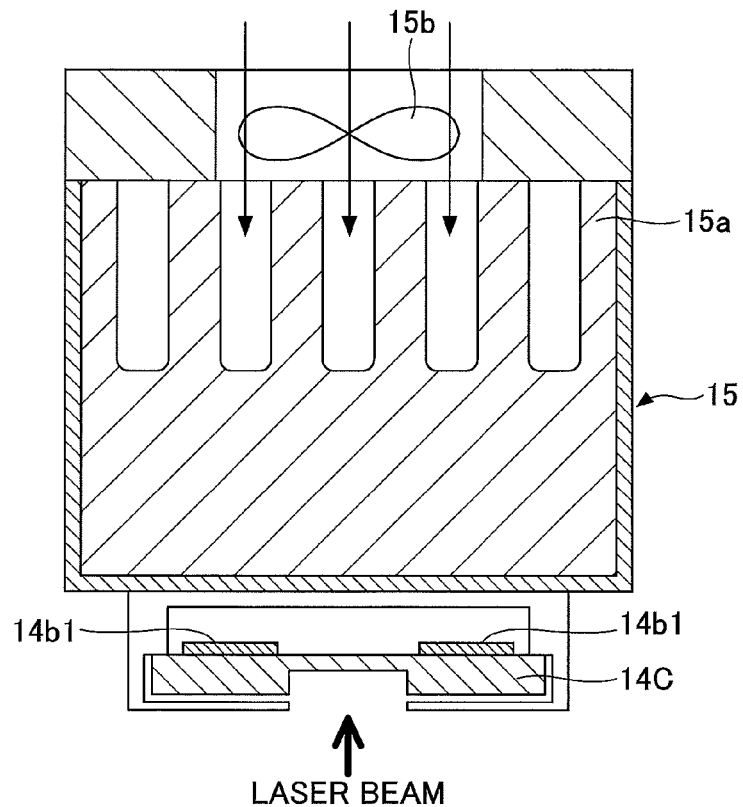
FIGS. 6A and 6B are diagrams for explaining a measurement principle of a power meter according to an embodiment of the present invention.
Figure 6B:
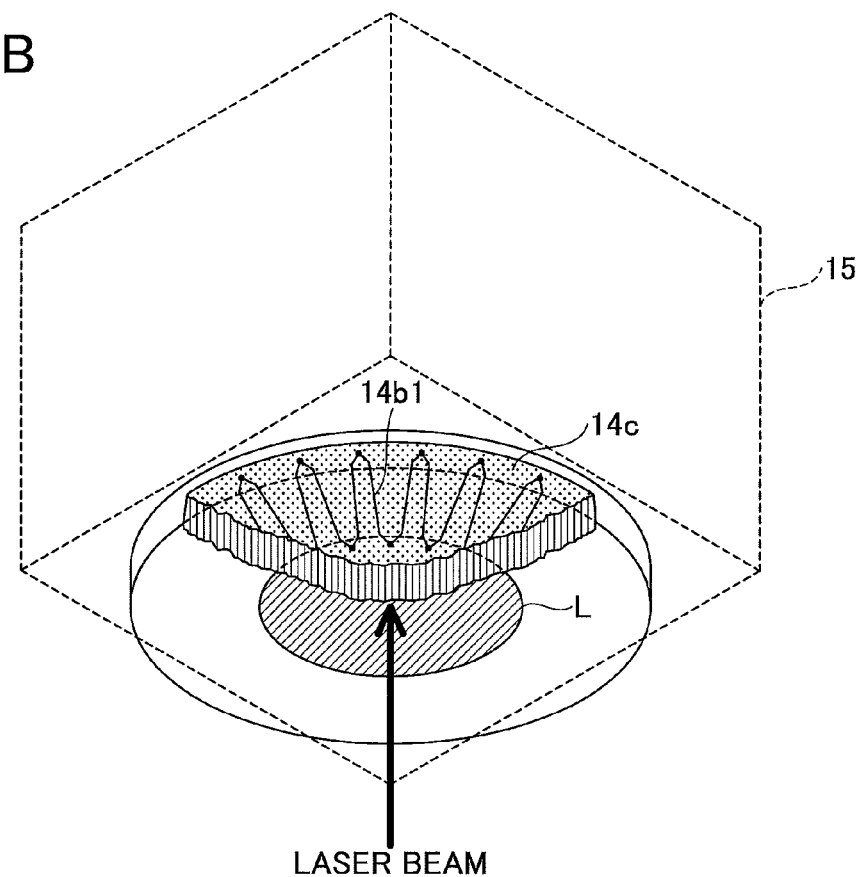

Next, a description is given below of a measurement principle of the power meter 15 with reference to FIGS. 6A and 6B. FIG. 6A illustrates a cross section of the power meter 15, and FIG. 6B mainly illustrates an absorption member of the power meter 15 and its surroundings. The disk-like member 14c is provided at the bottom part of the power meter 15. A material that absorbs the laser beam is applied to the disk-like member 14c. The disk-like member 14c may be made of a material that absorbs the laser beam. As illustrated in FIG. 6B, a thermocouple 14b1 is wired on an internal surface of the disk-like member 14c winding across the radial direction while alternately heading for the inner circumferential side and the outer circumferential side. As illustrated in FIG. 6A, the thermocouple 14b1 is provided between the light absorption material of the disk-like member 41c and a heat sink 15a. A fan 15b is disposed above the heat sink 15a to suction and take the air into the power meter 15. The heat sink 15a inside the power meter 15 is set at room temperature by rotating the fan 15b.

When the absorption member of the power meter 15 is irradiated with the laser beam from below, the absorption member absorbs and converts the laser beam into the heat in an area L of the disk-like member 14c. This causes a temperature of the area L (inner circumferential side) of the thermocouple 14b1 to be higher. The outer circumferential side of the thermocouple 14b1 is kept at room temperature by the heat sink 15a. Hence, the temperature difference occurs between the inner circumferential side and the outer circumferential side of the thermocouple 14b1. The power meter 15 converts the temperature difference generated in the thermocouple 14b1 into a current. The power meter 15 outputs the converted current to the monitor unit 51. The control unit 52 outputs the output value of the laser beam converted from the current value obtained through the monitor unit 51 based on the straight line P of the reference in FIG. 5.

[Configuration of Laser Generator]

Figure 7:
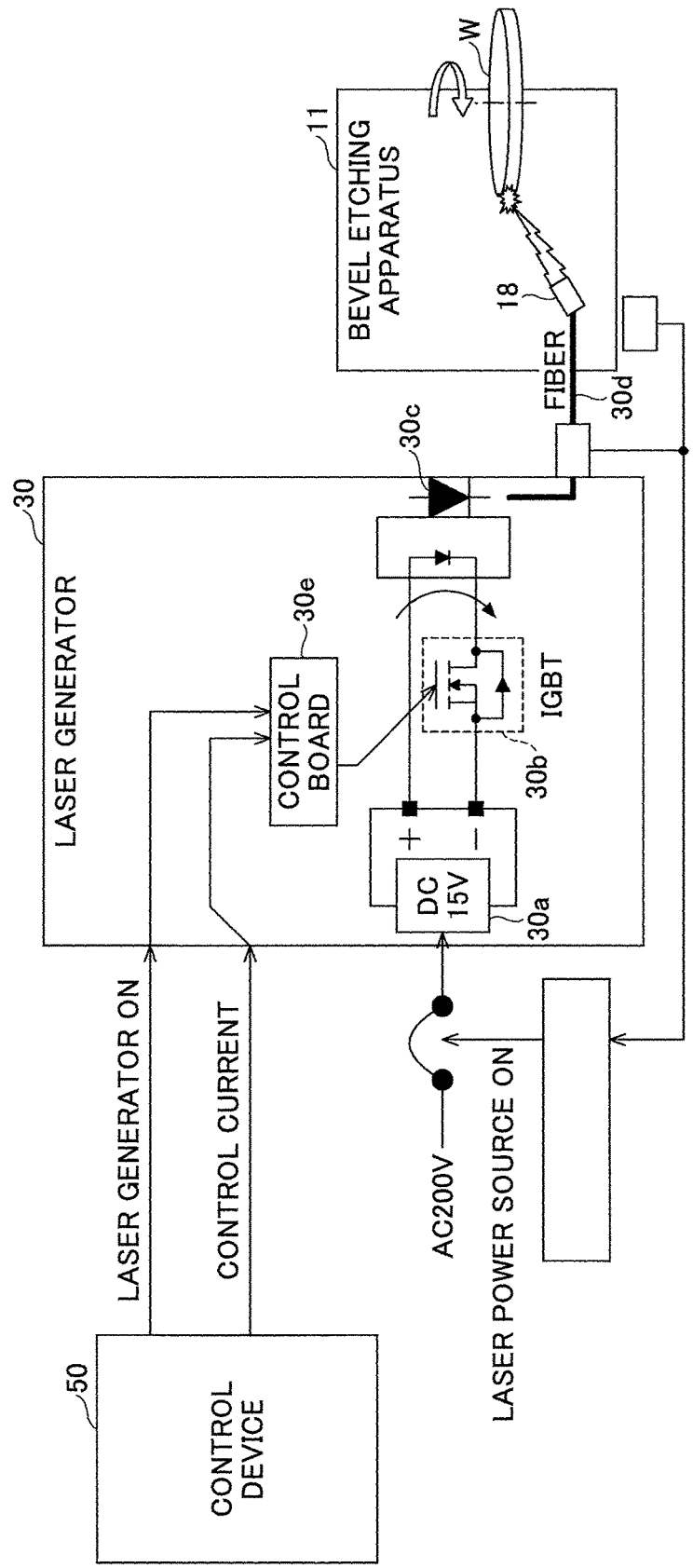
FIG. 7 is a diagram illustrating an example of a configuration of a laser generator according to an embodiment of the present invention.

Next, a description is given below of an example of a configuration of the laser generator 30 with reference to FIG. 7. FIG. 7 illustrates the example of the laser generator 30 according to the embodiment. The laser generator 30 of the embodiment includes a direct-current power source 30a, a current control element 30b (IGBT, Insulated Gate Bipolar Transistor), a control board 30e, and an oscillator 30c. The direct-current power source 30a supplies a current to a diode provided in the oscillator 30c, thereby outputting the laser beam. The current control element 30b controls the current (i.e., control current) supplied from the direct-current power source 30a to the diode of the oscillator 30c. The laser beam output from the laser generator 30 is transmitted through an optical fiber 30d and emitted from the laser irradiation head 18 to the bevel portion of the wafer W.

The control device 50 monitors the current supplied to the laser generator 30, and controls a current to be supplied to the oscillator 30 by performing feedback control to the monitored current based on the output value of the laser beam measured by the power meter 15.

[Internal Configuration of Laser Generator]

Subsequently, a description is given below of an example of an internal configuration of the laser generator 30 with reference to FIGS. 8A and 8B. FIG. 8A illustrates an example of a side view of the laser generator 30 according to the embodiment. FIG. 8B illustrates an example of a top view of the laser generator 30 according to the embodiment. The laser generator 30 in FIG. 8B shows a D-D plane of FIG. 8A. The laser generator 30 of the embodiment includes a stack 130, a microlens 131, a direct mirror 132, a redirect mirror 133, an edge mirror 134, and a focus lens 135.

Figure 9A:
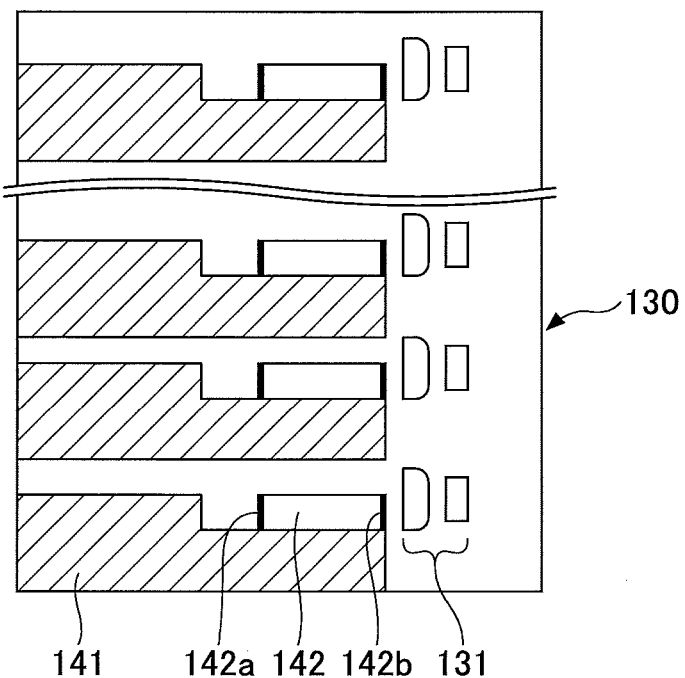
FIGS. 9A and 9B are enlarged diagrams of a stack (semiconductor laser) according to the embodiment of the present invention.
Figure 9B:
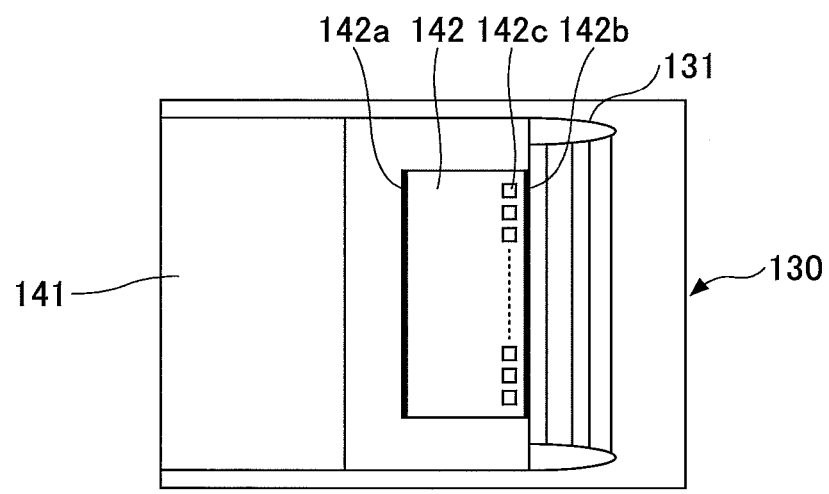

FIG. 9A illustrates an enlarged view of an arrangement part E of a semiconductor laser in the stack 130 of FIG. 8A. FIG. 9B illustrates an enlarged view of an arrangement part E of a semiconductor laser in the stack 130 of FIG. 8B. Semiconductor lasers 142 are disposed in a vertical direction in the stack 130. Multiple shelves 141 are stacked in the stack 130. A plurality of semiconductor lasers 142 is attached to a tip division (output side of the laser beam) of each of the shelves 141 on a one-to-one basis. As illustrated in FIG. 9B, about ten to about twenty diodes 142c are provided in the right end portion as elements to output the laser beam. Light is output from the semiconductor lasers 142 toward the right along the plane of paper by applying a direct voltage to the diodes 142c from the direct-current power source 30a (see FIG. 7) to cause a current to flow through the diodes 142c. With this structure, the laser beam is output from each of the semiconductor lasers 142 and enters the microlens 131.

A description is given below with reference to FIG. 8 again. The laser beam incident on the microlens 131 is focused on the direct mirror 132. The focused laser beam is further focused through the redirect mirror 133, the edge mirror 134 and the focus lens 135 and enters the optical fiber 30d.

The dry air is introduced into the laser generator 30 from an inlet IN and discharged from an outlet OUT. Thus, the inside of the laser generator 30 can be dried by causing the dry air to fill and circulate through the inside of the laser generator 30.

[Abnormality Detection of Laser Generator]

In the laser generator having such a configuration, the following variations can occur: (1) a malfunction of the stack 130 of the laser generator 30 or another portion; (2) a transmittance change of each of the lenses inside the laser generator 30; (3) an alignment change between the focus lens 135 and the optical fiber 30d when the laser beam focused by the focus lens 135 enters the optical fiber 30d or a state change of the optical fiber 30d; and (4) an absence of the dry air flowing in the laser generator 30.

The output value of the laser beam measured by the power meter 15 is changed by factors of (1) through (4). A decrease of the output value of the laser beam due to a malfunction of the semiconductor lasers 142 is taken as an example of (1). A decrease of the output value of the laser beam because all of the focused laser beam does not enter the optical fiber 30d due to misalignment, a change of a refractive index of the optical fiber 30d and a disconnection of the optical fiber 30d are taken as examples of (3). As illustrated in FIGS. 9A and 9B, both ends 142a and 142b of the semiconductor lasers 142 are coated with a reflective material, and the coated portions 142a and 142b function as a mirror. When the dry air does not flow through the laser generator 30, the moisture attaches to the coated portions 142a and 142b, and a transmittance and a reflectance of the coated portions 142a and 142b change. This causes the diode of the semiconductor lasers 142 to be destroyed, and/or reduces the output value of the laser beam. The above situation is taken as an example of (4).

In contrast, the bevel etching apparatus 1 according to the embodiment includes the power meter 15, which monitors the output value of the laser beam. Then, a problematic point such as a malfunction or a temporal change of the laser generator 30, a change of a refractive index or a disconnection of the optical fiber 30d or the like can be estimated based on a change of the measured output value of the laser beam. This makes it possible to estimate occurrence of the malfunction inside the laser generator 30 or the decrease of the output value of the laser beam from the laser generator 30 due to the temporal change of the laser generator 30.

For example, when the output value of the laser beam is determined to be out of the predetermined range between thresholds before processing the wafer W, the bevel etching apparatus 1 of the embodiment determines that the output value of the laser beam of the bevel etching apparatus 1 is abnormal and may temporarily stop its operation. This can prevent the next wafer W from being irradiated with the laser beam having high intensity and can prevent the bevel portion of the wafer W from being scraped and chipped.

Figure 10:
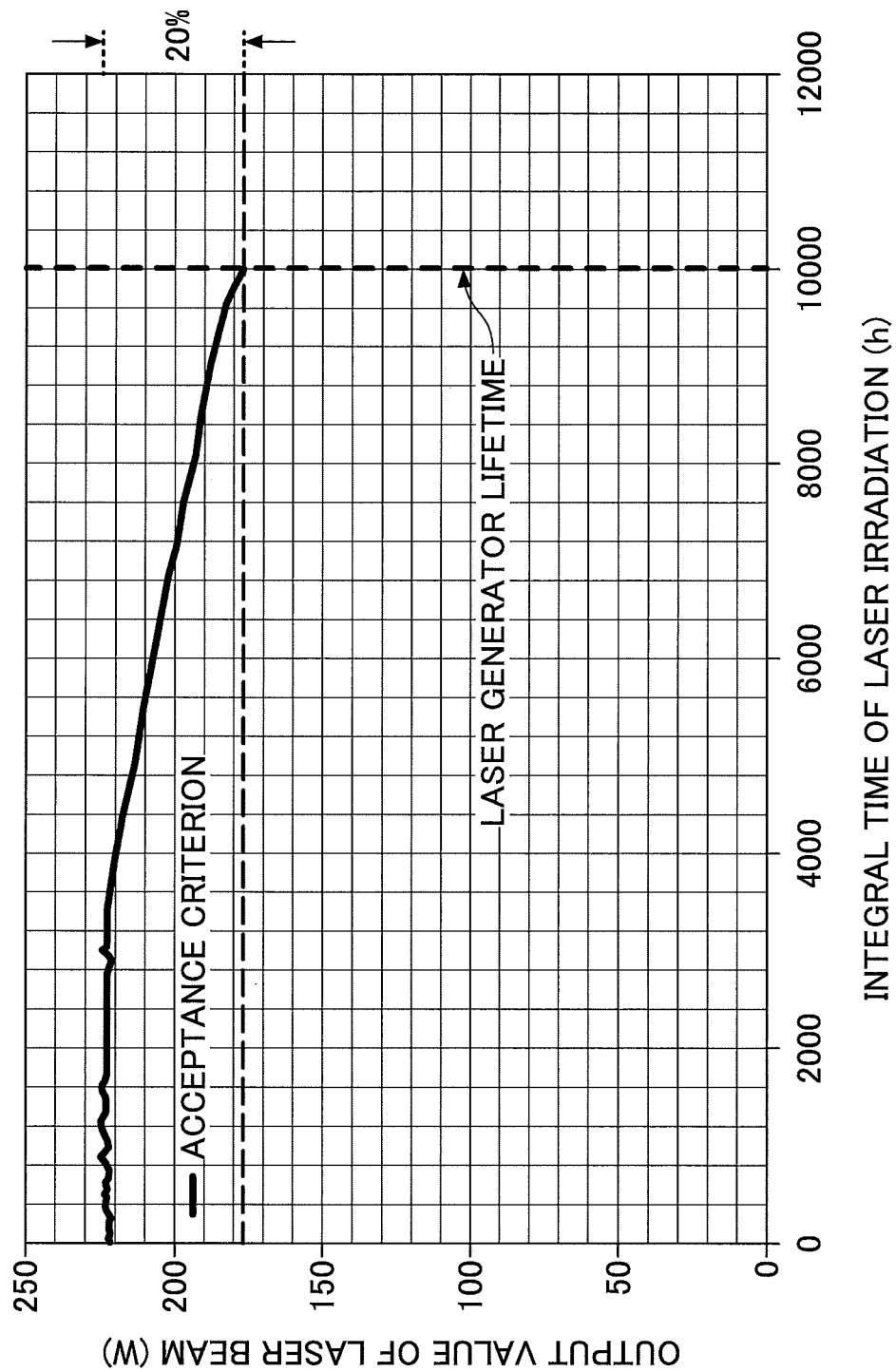
FIG. 10 is a graph illustrating an example of a temporal variation of an output of a laser generator according to the embodiment of the present invention.

Moreover, the output value of the laser beam output from the laser generator 30 of an embodiment changes with time. FIG. 10 illustrates an example of a temporal change of the laser beam output from the laser generator 30. According to the graph, when an output value of the laser beam decreases by 20% from an output value of the laser beam at the time the laser generator 30 is new, in other words, when integral time of the laser irradiation becomes 10,000 hours or more, the semiconductor lasers 142 of the laser generator 30 can be estimated to come to the end of their lives.

From such estimation, the bevel etching apparatus 1 of the embodiment can automatically correct the output value of its laser beam in response to the temporal change of the laser beam output from the laser generator 30 based on the output value of the laser beam measured by the power meter 15.

For example, when the change of the output value of the laser beam measured by the power meter 15 is determined to be within predetermined thresholds, the bevel etching apparatus 1 of the embodiment determines that the temporal change of the output value of the laser beam is in a normal range. When determined to be in the normal range, the bevel etching apparatus 1 controls a control current to be supplied to the laser generator 30 and automatically corrects the output value of the laser beam output from the laser irradiation head 18. This can prevent the bevel portion of the wafer W from being scraped and chipped. In addition, at this time, because the operation of the bevel etching apparatus 1 is not stopped, the productivity can be maintained without reducing the throughput.

As discussed above, according to the etching method and the bevel etching apparatus 1 of the embodiments of the present invention, by monitoring the laser beam before irradiating the bevel portion of the wafer W, the abnormality or the temporal change of the output of the laser beam can be detected.

In other words, according to the embodiments of the present invention, a laser beam before irradiating a bevel portion of a substrate is monitored, and a variation of an output value of the laser beam can be detected.

Although an etching method and a bevel etching apparatus have been described in the above embodiments, the etching method and the bevel etching apparatus of the present invention is not limited to the embodiments. In this regards, numerous variations and modifications are possible without departing from the scope of the present invention, and may be appropriately determined depending on such variations and modifications that may be made.

A substrate to be processed in the bevel etching apparatus of the present invention is not limited to the (semiconductor) wafer used in the description of the embodiments, but for example, may be a large substrate for a flat panel display, a substrate for an EL (electroluminescence) device or a solar cell.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. An etching method using a bevel etching apparatus configured to etch a substrate by emitting a laser beam and including a laser generator, a laser irradiation head, and a power meter configured to measure the laser beam output from the laser generator, the method comprising steps of:
   moving the laser irradiation head from a first position, at which the laser beam can irradiate the substrate, to a second position, at which the laser beam cannot irradiate the substrate;
   irradiating the power meter with the laser beam for two to ten seconds at the second position;
   measuring an output value of the laser beam by the power meter;
   determining whether the measured output value of the laser beam is in a range of predetermined thresholds with respect to an output setting value of the laser beam output from the laser generator;
   returning the laser irradiation head to the first position to irradiate the substrate with the laser beam, whereby the substrate is etched.

2. The method as claimed in claim 1, wherein the range of the predetermined thresholds is in a range of −10% to +10%.

3. The method as claimed in claim 1, further comprising a step of:
   automatically correcting the output value of the laser beam output from the laser generator upon determining that the measured output value of the laser beam is out of the range of the predetermined thresholds.

4. The method as claimed in claim 1, further comprising a step of:
   performing a predetermined error process upon determining that the measured output value of the laser beam is out of the range of the predetermined thresholds.

5. The method as claimed in claim 4, wherein the error process comprises at least one of a step of outputting an alarm and a step of stopping an operation of the bevel etching apparatus.

* * * * *